US006954360B2

(12) United States Patent
Nurminen

(10) Patent No.: US 6,954,360 B2
(45) Date of Patent: Oct. 11, 2005

(54) THERMALLY ENHANCED COMPONENT SUBSTRATE: THERMAL BAR

(75) Inventor: Janne T Nurminen, Oulunsalo (FI)

(73) Assignee: Nokia Corporation, Espoo (FI)

( * ) Notice: Subject to any disclaimer, the term of this patent is extended or adjusted under 35 U.S.C. 154(b) by 132 days.

(21) Appl. No.: 10/646,410

(22) Filed: Aug. 22, 2003

(65) Prior Publication Data

US 2005/0041396 A1 Feb. 24, 2005

(51) Int. Cl.[7] .................................................. H05K 7/20
(52) U.S. Cl. ........................ 361/704; 174/252; 257/713; 361/719; 361/720
(58) Field of Search .................. 174/252; 257/706–707, 257/712–713; 361/704, 707, 710, 794, 714–721; 438/125–126, 213

(56) References Cited

U.S. PATENT DOCUMENTS

| 5,027,191 | A | | 6/1991 | Bourdelaise et al. ........... 387/74 |
| 5,710,459 | A | * | 1/1998 | Teng et al. .................. 257/717 |
| 5,741,729 | A | * | 4/1998 | Selna .......................... 438/125 |
| 6,212,076 | B1 | * | 4/2001 | MacQuarrie et al. ........ 361/720 |
| 6,282,094 | B1 | * | 8/2001 | Lo et al. ...................... 361/704 |
| 6,483,187 | B1 | | 11/2002 | Chao et al. .................. 257/712 |
| 6,525,942 | B2 | | 2/2003 | Huang et al. ................ 361/704 |
| 6,657,864 | B1 | * | 12/2003 | Dyckman et al. ........... 361/704 |
| 6,882,537 | B2 | * | 4/2005 | Barcley ....................... 361/719 |

* cited by examiner

Primary Examiner—Gregory Thompson
(74) Attorney, Agent, or Firm—Harrington & Smith LLP

(57) ABSTRACT

An IC package dissipates thermal energy using thermal bars. The IC package includes a substrate material with a die pad area, which is suitable to support an integrated circuit. A plurality of solder ball pads is disposed on a first surface of the substrate material and a plurality of conductive thermal bars radiate outwardly from the die pad area and extend to the edge of the substrate component to facilitate the dissemination of thermal energy from the die pad area to the substrate and/or printed wiring board.

12 Claims, 11 Drawing Sheets

THERMALLY ENHANCED COMPONENT SUBSTRATE: THERMAL BAR

TECHNICAL FIELD

This invention relates generally to dissipating thermal energy (heat) from a die pad. More particularly, this invention relates to a thermally enhanced substrate thermal bar that reduces thermal resistance of a circuit package by integrating radial heat transfer elements from under the die pad to the component edge.

BACKGROUND

In attempting to use the area on printed wiring boards (PWB) and printed circuit boards (PCB) more efficiently, semiconductor chip manufactures have been switching from larger, more cumbersome interconnection techniques, such as pin grid arrays ("PGAs") and perimeter leaded quad flat packs ("QFPs"), to smaller assemblies, such as ball grid arrays ("BGAs"). Using BGA technology, semiconductor chips are typically interconnected to their supporting substrates using solder connections. However, the columns of solder are generally designed to be relatively short to maintain the solder's structural integrity, which reduces elastic properties, resulting in increased susceptibility to solder cracking due to a differential between the coefficient of thermal expansion ("CTE") of the chip relative to the CTE of the supporting substrate. Thus, as the chip heats up during use, both the chip and the substrate expand; and when the heat is removed, both the chip and the substrate contract. The difference between the chip CTE and the substrate CTE can result in catastrophic deformation.

Therefore, the ability to dissipate heat that is generated from the operation of integrated circuits (IC) is a major design concern for the electronic industry. This is emphasized because the density of circuits on IC devices has increased substantially in recent years and the reliability and performance of these high density circuits are affected by the thermal environment. Additionally, size considerations require that an increased number of electronic packages be installed into very small spaces, which also greatly increases the need to efficiently dissipate heat from IC packages. As the features of semiconductor chips continue to be reduced in size, the number of chips packed into a given area will be greater and the heat dissipated by each of these chips will have a greater effect on the thermal mismatch problem discussed above.

Furthermore, IC devices are increasingly being used for high power applications. While many early IC chips operated below a few watts, ICs are being designed to operate around 10 watts, which substantially increases heat generation and the need to effectively dissipate the heat.

In some conventional semiconductor packages, heat generated from a semiconductor chip or integrated circuit (IC), which is typically mounted on a die pad of a substrate, is emitted through two routes. The first route is through external connection terminals of the package and the second route is through the surface of the package. In order to more effectively dissipate the heat, a heat sink can be attached to the package. In a ball grid array (BGA) package, which includes an encapsulating resin formed by molding a semiconductor chip with a plastic resin, the heat sink may be attached directly to the encapsulating resin of the package. Thus, the heat generated from the chip is conducted to the heat sink via the encapsulant and dissipated to the outside by convection.

Other approaches to solve the problem of heat dissipation include adding additional thermal balls under the die area. However, this approach requires modification of the package design and possibly a layout change as well as possible modification of the PWB or PCB design. Another approach is to modify the package type and/or reduce the required power. These approaches are not satisfactory since they require major design changes.

Bourdelaise et al. disclose in U.S. Pat. No. 5,027,191, a chip carrier assembly utilizing a cavity down chip with a pad grid array. The IC chip within the chip carrier is mounted against a surface opposite the PWB to which the chip is attached such that heat transfer from the IC chip may occur along a short path to a heat sink to enable a larger heat transfer rate. The improvement of heat transfer rate is still quite limited due to a small gap that is usually required on the top surface of an IC chip to allow bonding wires to extend from the chip to connection pads surrounding the chip. This small gap between the IC chip and the flat thermal pad serving as a heat sink substantially reduces the heat transfer rate.

Huang et al. disclose in U.S. Pat. No. 6,525,942, a heat dissipation ball grid array (BGA) package. The heat dissipation BGA package includes a plurality of first thermal ball pads formed on the underside of a substrate in the area covered by a chip. The BGA package also includes a plurality of second thermal ball pads or a heat dissipation ring outside the first thermal ball pads. A plurality of signal ball pads is formed outside the second thermal ball pads or the heat dissipation ring. The second thermal ball pads or heat dissipation ring is connected to the first thermal ball pads by conductive trace lines. A plurality of first thermal balls is attached to the respective first thermal ball pads and the signal balls are attached to the respective signal ball pads. The first thermal balls and the signal balls are in contact with corresponding contact points on a printed circuit board. A plurality of second thermal balls is attached to the respective second thermal ball pads or the surface of the heat dissipation ring. The heat dissipation disclosed in Huang is limited because the die pad conducts thermal energy to the first and second thermal balls only through the vias.

Chao et al. disclose in U.S. Pat. No. 6,483,187, a heat spread substrate that includes a metal heat spreader, which has a surface with a cavity that is adapted to support a die. The surface also includes a ground ring arranged at the periphery of the cavity, a substrate-supporting surface surrounding the periphery of the ground ring, a plurality of ground pads arranged at the periphery of the substrate-supporting surface and a plurality of ground pads arranged on the substrate-supporting surface and protruding from it. The substrate also has a plurality of through holes, a plurality of mounting pads and a plurality of ball pads. Chao discloses that a thickness decreasing process is carried out on one of the surfaces of the metal heat spreader to decrease the thickness of part of the areas on the surface. The thickness decreasing process can be accomplished by stamping processes, or by multi-photolithography and half-etching. One drawback to varying the thickness of the heat spreader to dissipate heat is that it requires specific fabrication steps to produce the desired heat spreader shape.

With the above limitations and difficulties, there is still a need in the art of IC packaging techniques to resolve these difficulties and limitations. Specifically, there is a need in the art to provide improved heat dissipation for high power ICs and meanwhile increase the packaging integrity.

SUMMARY OF THE PREFERRED EMBODIMENTS

The foregoing and other problems are overcome, and other advantages are realized, in accordance with the presently preferred embodiments of these teachings.

Accordingly, one embodiment of the present invention is directed to an integrated circuit package and a method of fabrication therefor. The package includes a substrate having a first surface and a second surface and a die pad area, which has dimensions suitable to mount an integrated circuit. A thermally conductive radial structure is disposed at least partially around the die pad area on the first surface while a corresponding thermally conductive radial structure is disposed underlying the first thermally conductive radial structure on the second surface. A plurality of thermally conductive ball pads is disposed on the first surface of the substrate outside the die pad area and a plurality of vias is disposed on an associated ball pad. The vias provide thermal conductivity from the first surface of the substrate to the second surface of the substrate. A plurality of thermally conductive thermal bars radiate outwardly from the die pad area, such that each thermal bar covers an area extending from the die pad area to the first thermally conductive radial structure, encompassing a plurality of associated ball pads. The thermal bars are electrically isolated from a plurality of electrically signal conveying vias disposed between the first and second surface. The thermal bars conduct thermal energy from the first surface of the substrate to the second surface of the substrate to the PWB.

Another embodiment of the present invention is directed to the integrated circuit package and method as described above, and further including a plurality of thermally conductive thermal bars disposed on the second or bottom surface of the substrate underlying the first plurality of thermal bars and that are thermally coupled to the second thermally conductive radial structure. The thermal bars are in thermal contact with associated vias. A plurality of signal balls are disposed on the second surface of the substrate, outside the die pad area, in thermal contact with associated vias for dissipating thermal energy from the second surface of the substrate to the PWB.

Yet another embodiment of the present invention is directed to the integrated circuit package and method as described above that also includes a printed wiring board on which the substrate is mounted. Thermal energy is dissipated from the die pad area to the printed wiring board through the thermal bars and the thermally conductive radial structure that forms a continuous thermal dissipation path.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

The present invention addresses the need for the integrated circuit packages and MCM components to minimize thermal resistance from the die to the printed circuit board (PCB) by integrating radial heat transfer elements from under the die area to the component edge area which can be used to transfer heat from the component area to the surrounding PCB area. The present invention is particularly useful in applications where an enhanced thermal path from the die to the component edge is required.

The present invention integrates radial heat transfer elements from under the die area to the component edge area. The small area of the die can be extended by using a plurality of conductive elements, including thermal bars and a thermally conductive radial structure that is disposed at least partially around the die pad area, that extend from the die pad area and thus the thermally conductive area becomes wider and reduces overall thermal resistance of the package.

The shape and dimensions of the conductive elements is a design choice. While the thermal bars are shown to extend over two adjacent rows of solder ball pads, the invention is not limited to this configuration. The thermal bars may also encompass a single row of solder ball pads or a plurality of rows of solder ball pads or other configurations. Further while the thermally conductive radial element is shown to completely encompass the component edge area, the invention is not limited to this configuration. The thermally conductive radial element may only partially encompass the component edge area. Other configurations are also possible. Specific dimensions of the conductive elements are a function of the particular application and are subject to factors such as circuit parameters, component materials and environments.

Some advantages of the present invention include: better thermal performance of the package; no addition to the cost of manufacturing work or materials; reduces the die shrink thermal effects; decreased thermal resistance of the package; increased package power; increased package reliability; no need for package changes when the die shrinks; no need for re-design of the PWB; less thermal sensitivity; robust assembly; and lower overall cost.

In the present invention, the thermal conductivity element is integrated in the component when copper surfaces of the substrate are generated. The thermal path is created by using copper bars from the die to the PWB copper planes. The copper bars conduct heat directly to the PWB. The present invention may be used with single layer and/or multilayer substrates.

An epoxy/solder resist coating may be used to isolate electrical contacts between the die and signals.

Figure 1:
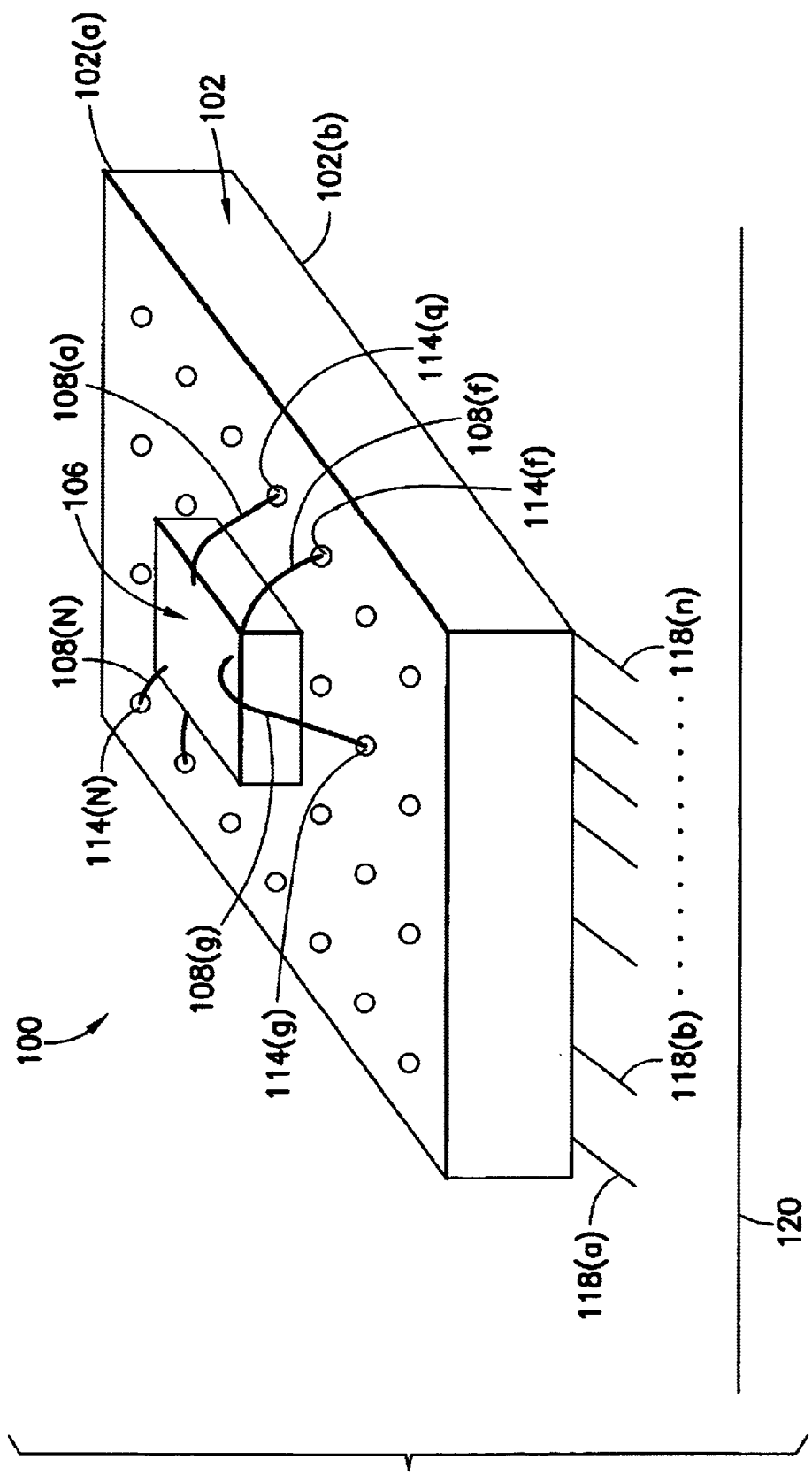
FIG. 1 shows an IC package mounted on a printed circuit board.

FIG. 1 shows an IC package 100, which includes substrate 102 and IC chip 106. The IC package 100 is mounted on PCB or PWB 120, typically via interconnectors 118(a) . . . (n), where n is any suitable number that comports with the design of the IC package 100.

The IC chip 106 is mounted on substrate 102 typically by epoxy or resin suitable to adhere IC chip 106 to a die pad area of substrate 102. Preferably, the material used to adhere chip 106 to substrate 102 has acceptable thermal conductive properties. Wires 108(a) . . . (n), where n is any suitable number, electrically connect portions of IC chip 106 to selected ones of solder ball pads 114(a) . . . (n), where n is any suitable number. A solder ball may be mounted on a corresponding solder ball pad to electrically connect the wire 108 to another location. The substrate 102 has a first surface 102(a) (a chip-facing surface) and a second surface 102(b) (a PWB-facing surface).

Figure 2:
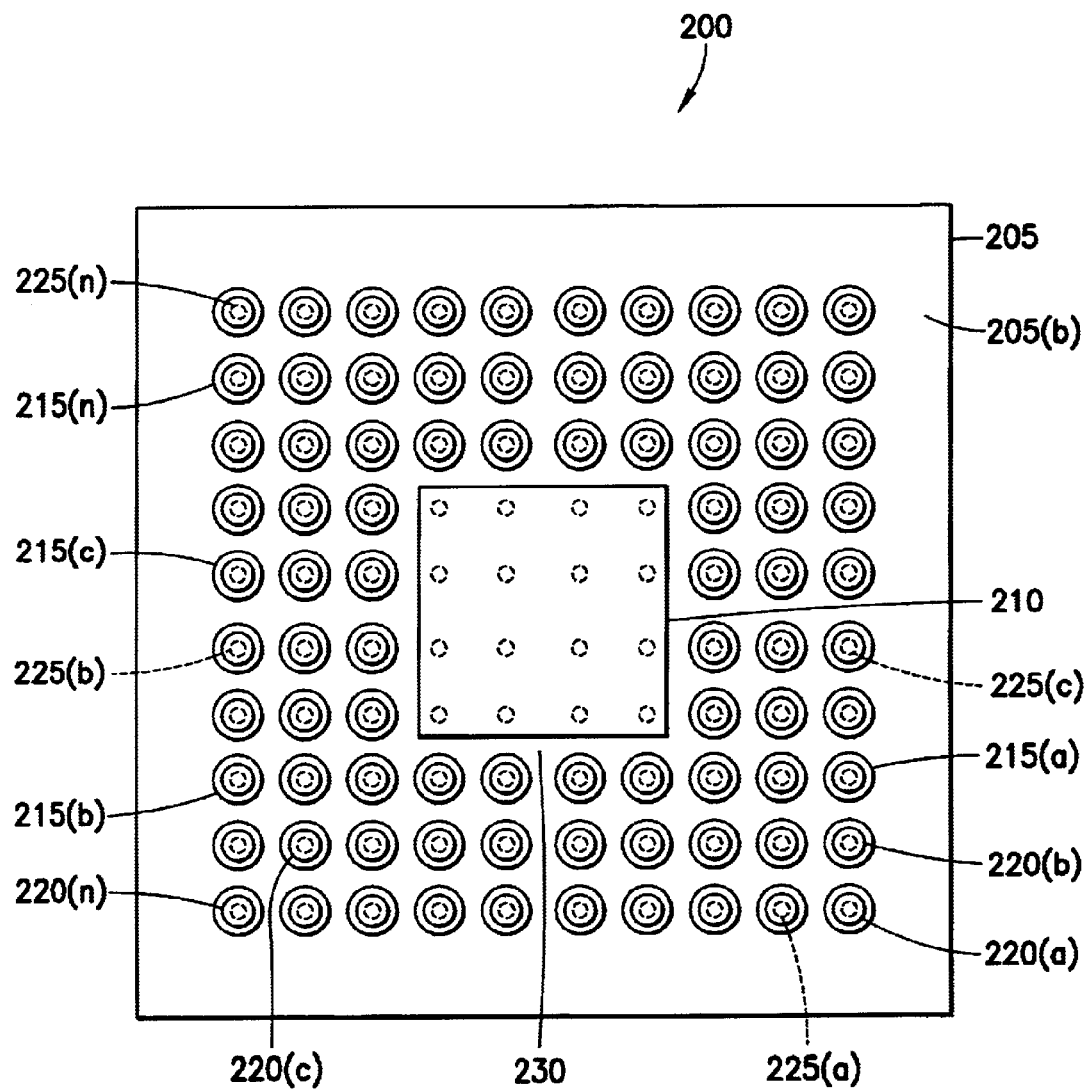
FIG. 2 shows a conventional substrate from the solder ball side.

FIG. 2 shows a view 200 of a conventional substrate from the solder ball side, or PWB facing surface 205(b). The substrate 205 has a die pad area 210 mounted on surface 205(b). Solder ball pads 215(a) . . . (n), generally 215, support an associated thermally conductive solder ball 220(a) . . . 220(n), generally 220, which disseminates thermal energy. A corresponding via, through bore or hole 225(a) . . . (n), generally, 225, facilitates the dissemination of thermal energy (heat) by providing a path for the thermal energy through the substrate material 205. It is an embodiment of the invention that either each solder ball pad 215 may have a corresponding solder ball and via or the solder ball pad may not have a solder ball thereon. As shown in FIG. 2, the die pad 210 is thermally insulated from the solder ball pads 215, and thus the solder balls 220, by thermally insulating material 230. This design reduces the efficiency of removing thermal energy (heat) that is generated by an IC chip mounted on die pad area 210.

Figure 3A:
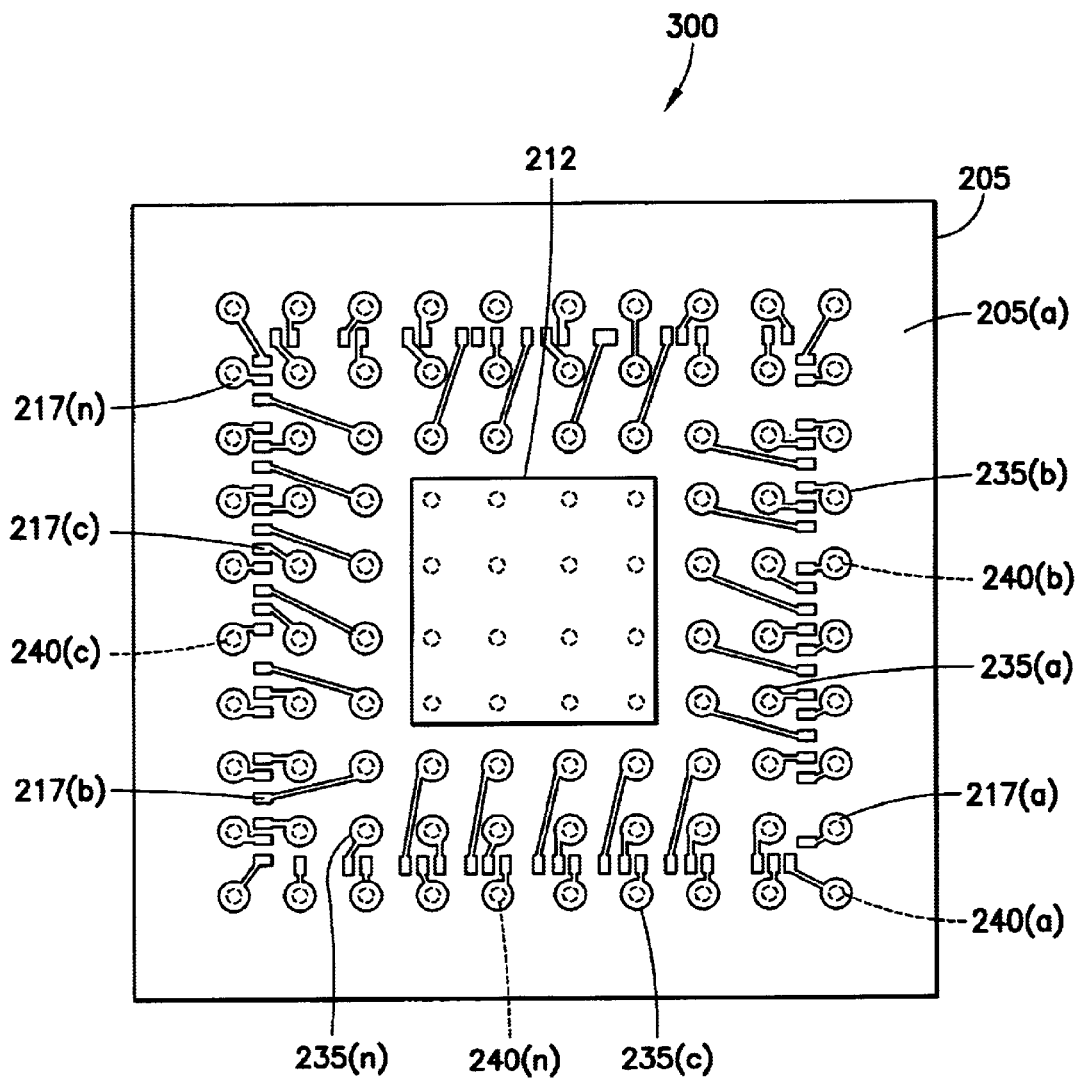
FIG. 3(a) shows a conventional substrate from an upper side.

FIG. 3(a) shows a view 300 of a conventional substrate 205 from a chip-facing side. The substrate 205 has an upper surface 205(a) on which a die pad area 212 is mounted. Top layer via pads 217(a) . . . (n), generally 217, and circuit traces 235(a) . . . (n), generally 235 are also shown. Vias, through bores or holes, 240(a) . . . (n), generally 240, enable thermal energy to conduct through the substrate 205.

Figure 3B:
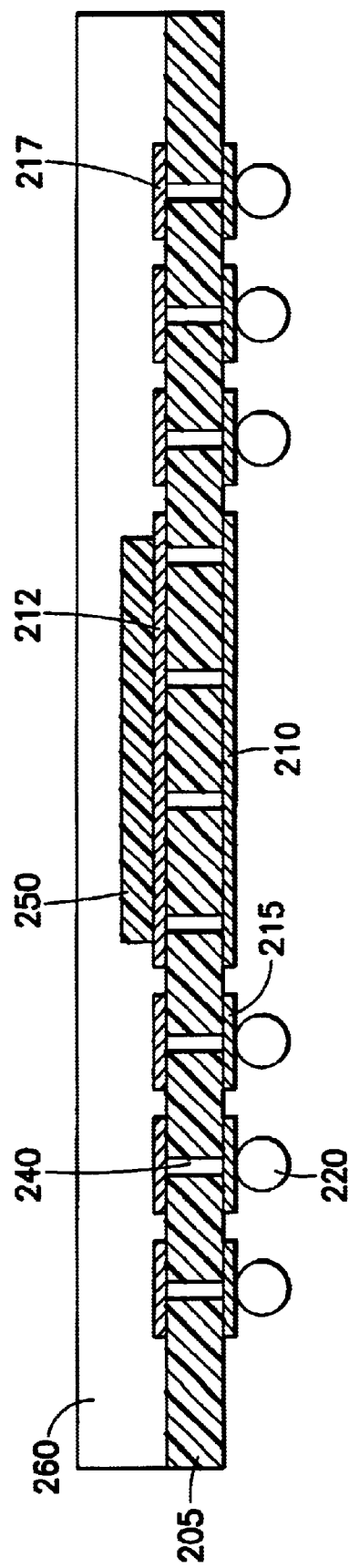
FIG. 3(b) shows a cross-sectional illustration of a conventional integrated circuit package.

FIG. 3(b) shows a cross-sectional illustration of a conventional integrated circuit. The substrate 205 has a top layer die pad area 212 and a bottom layer die pad area 210, mounted on substrate 205. Solder ball pads 215 support an associated thermally conductive solder ball 220, which disseminates thermal energy. Top layer via pads 217 are also shown. A corresponding via, through bore or hole 240 facilitates the dissemination of thermal energy by providing a path for the thermal energy through the substrate material 205. A die 250 and mold 260 are also shown.

Figure 4:
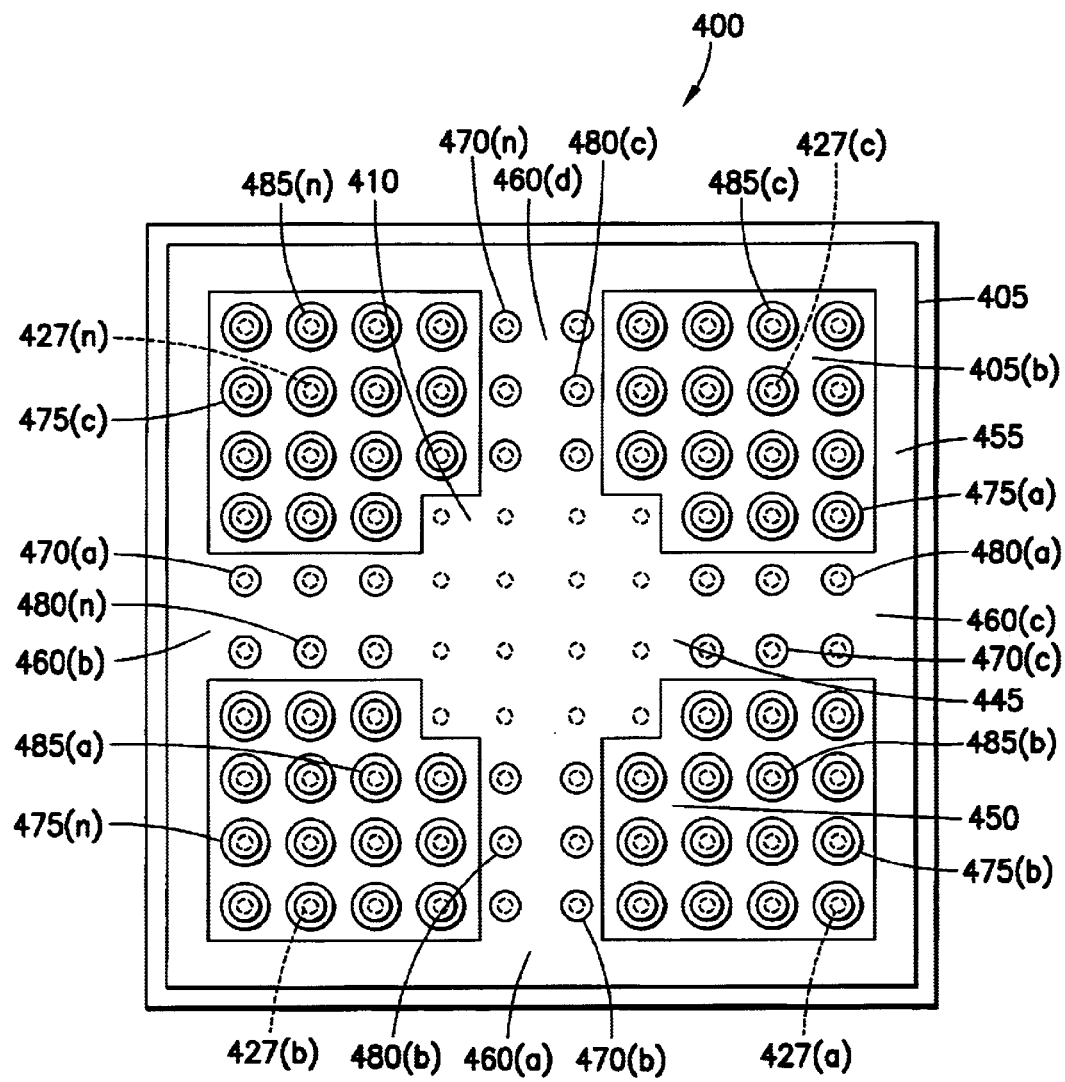
FIG. 4 shows a substrate, from the solder ball side, according to the present invention.

FIG. 4 shows a view 400 of a substrate, from the solder ball side, according to the present invention. Substrate 405 has a PWB facing surface 405(b) that has a first region 445, a second region 450 and a component edge region 455. The first region 445 includes the die pad area 410 as well as a thermal bar area 460(a) . . . (d), generally 460, that extends from the die pad to the thermally conductive radial component edge region 455. The die pad area 410 is adapted to support an IC chip thereon. The first set of thermally conductive elements, 470(a) . . . (n), generally 470, may be for example, solder ball pads, or metal surface area. The thermally conductive elements 470 are adapted to connect to a solder ball for heat dissipation. First solder ball pads 470 and second thermally conductive elements 475(a) . . . (n), generally 475, which may also be solder ball pads or metal surface area, are disposed on the PWB facing surface 405(b).

A solder mask may be used to expose the solder ball pad surfaces, or the solder ball pads 470 may be deposited on the surface 405(b) by chemical deposition, etching, stamping or other technique. The first solder ball pads 470 are located in the extended die pad area 410, which is shown as region 445 and the second solder ball pads 475 are located further away from the die pad area, in a region identified as 450. Typically solder balls, 480(a) . . . (n), generally 480, and 485(a) . . . (n), generally 485, are mounted on the surface of the ball pads 470, 475.

Die pad mounting area 410 is disposed in the first region 445 of surface 405(b). A thermally conductive material, such as copper is disposed on the substrate. The thermally conductive material includes thermal bars 460(a) . . . (d), generally 460, that extend or radiate from the die pad area 410 to the thermally conductive radial component edge region 455 (comprised of the same thermally conductive material) and include selected thermally conductive elements, or solder ball pads. The selected thermally conductive elements are typically first thermally conductive elements 470. Each thermal bar 460 of the thermally conductive material is typically associated with a number of the first set of thermally conductive elements.

The thermally conductive material 455, 460, is typically formed by etching, stamping, photoresist, chemical vapor deposition, or other technique. Typically the first plurality of solder ball pads 470 are in contact with the thermal bars 460. Thus, the thermally conductive bars 460 provide a path for thermal energy to dissipate from the die pad area 410 to the thermally conductive radial component edge area 455 to the PCB. While it is an embodiment of the present invention that a thermal bar 460 is in contact with corresponding thermally conductive elements 470, it is also within the present invention that other designs and configurations may be used for the thermal bars 460 to dissipate heat through the substrate 405.

The dimensions of the thermally conductive bars 460 are typically a function of the design of the package and can have a number of configurations. The thermally conductive bars 460 may expand outwardly to the thermally conductive radial component edge area 455 in a number of patterns. While it is shown in FIG. 4 that the thermal bars 460 encompass two adjacent rows of solder ball pads, the invention is not limited to this configuration. Other exemplary configurations may include a thermal bar encompassing a single row or a plurality of rows of solder ball pads as well as other designs. Further while the thermally conductive radial element is shown to completely encompass the component edge area 455, the invention is not limited to this configuration. The thermally conductive radial element may only partially encompass the component edge area 455. Other configurations are also within the scope of the invention.

Solder balls 480, 485 may be used for connecting with contacts on a printed circuit board, thereby forming electrical connections or thermal conductive junctions. The solder balls 480, 485 are typically fabricated from a material including a lead-tin alloy or copper, or copper-based alloy. Besides transferring the heat generated by a chip on the die pad area 410 away from the die pad area to the printed circuit board, the solder balls 480, 485 also form an electrical connection between the printed circuit board and the IC chip serving as ground or power point connections.

Vias, or through bores 427(a) . . . (n), generally 427, provide a path for thermal energy and electrical current through the substrate 405. Vias or through bores 427, are disposed on the second region 450 of substrate 405. Typically each via 427 is associated with a corresponding one of the second set of thermally conductive elements, or ball pads, 475. The ball pads 475 are distinguished from ball pads 470 because ball pads 470 are associated with a conductive thermal bar while ball pads 475 are not associated with a conductive thermal bar.

Figure 5:
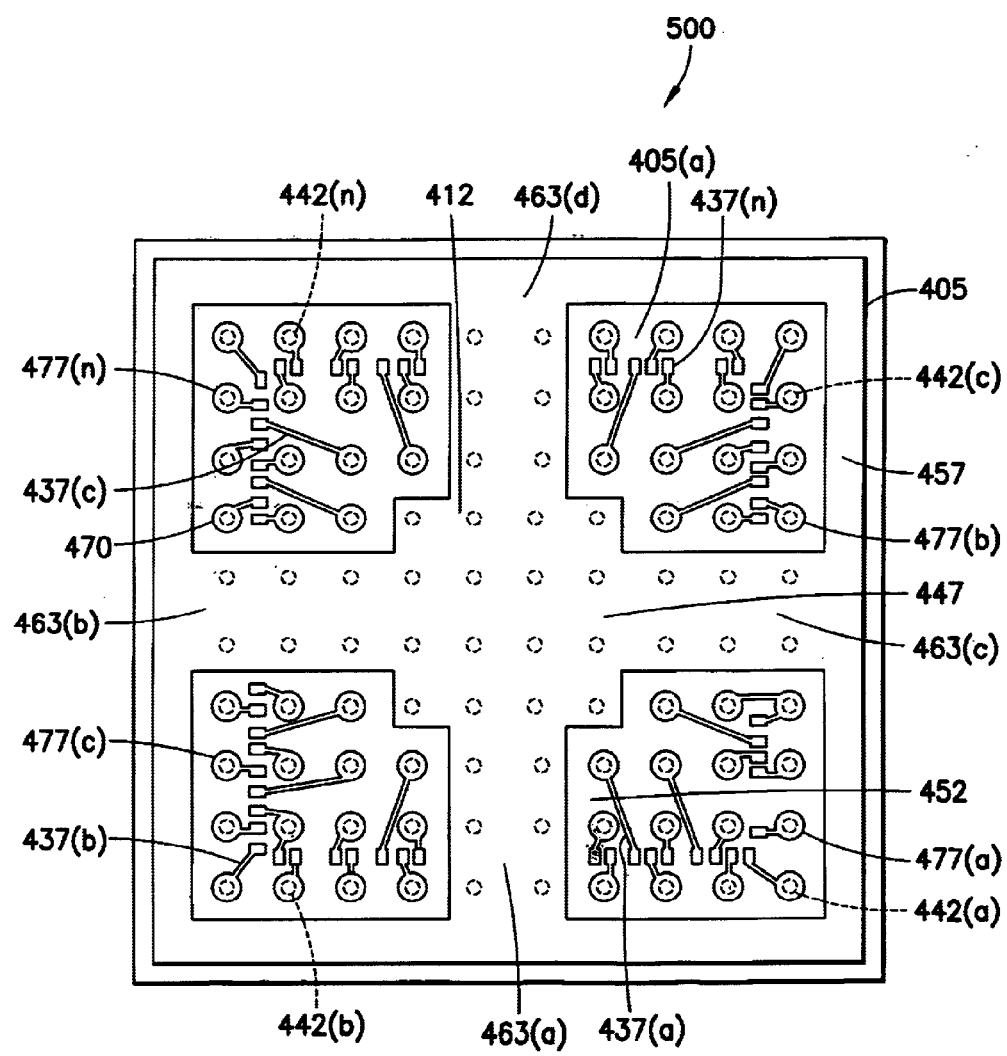
FIG. 5 shows a substrate, from the upper side, according to the present invention.

FIG. 5 shows a view 500 of substrate 405, from the top side, according to the present invention. Surface 405(a) has a die pad area 412 that has thermal bars 463(a) . . . (d), generally 463, that radiate from the die pad area 412 to the thermally conductive radial component edge area 457. (The die pad area 412 shown in FIG. 5 is the die pad on surface 405(a) and is similar in dimension to die pad area 410 of surface 405(b), shown in FIG. 4. Also, thermal bars 463 shown in FIG. 5 may have similar dimensions to the thermal bars 460 shown in FIG. 4.) The thermal bars 463 enhance thermal dissipation from the die pad area 412 to the thermally conductive radial component edge area 457 to the PWB.

A set of thermally conductive elements (also referred to as solder ball pads, 477(a) . . . (n), generally 477, are located in a second region 452, which is outside the first region 447. The thermally conductive elements 477 may be used to support a solder ball that is used for thermal or electrical conduction. Circuit traces, or pattern traces, 437(a) . . . (n), generally 437, which are used to conduct electrical current, are also shown. The substrate 405 typically has a laminated insulating layer. The insulating layer may be formed from a glass epoxy resin (FR-4, FR-5), bismaleimide-triaze (BT) or epoxy resin. The pattern trace layer may be formed by depositing a conductive material such as copper, nickel, palladium, silver, nickel palladium alloy or alloys thereof. Alternatively, the pattern trace layer can be formed by a technique, such as photolithography, etching, plating or other chemical process, depending on design considerations.

Vias, or through bores, 442(a) . . . (n), generally 442, are also shown in FIG. 5. These vias 442 extend from surface 405(a) to surface 405(b), shown in FIG. 4.

Figure 6:
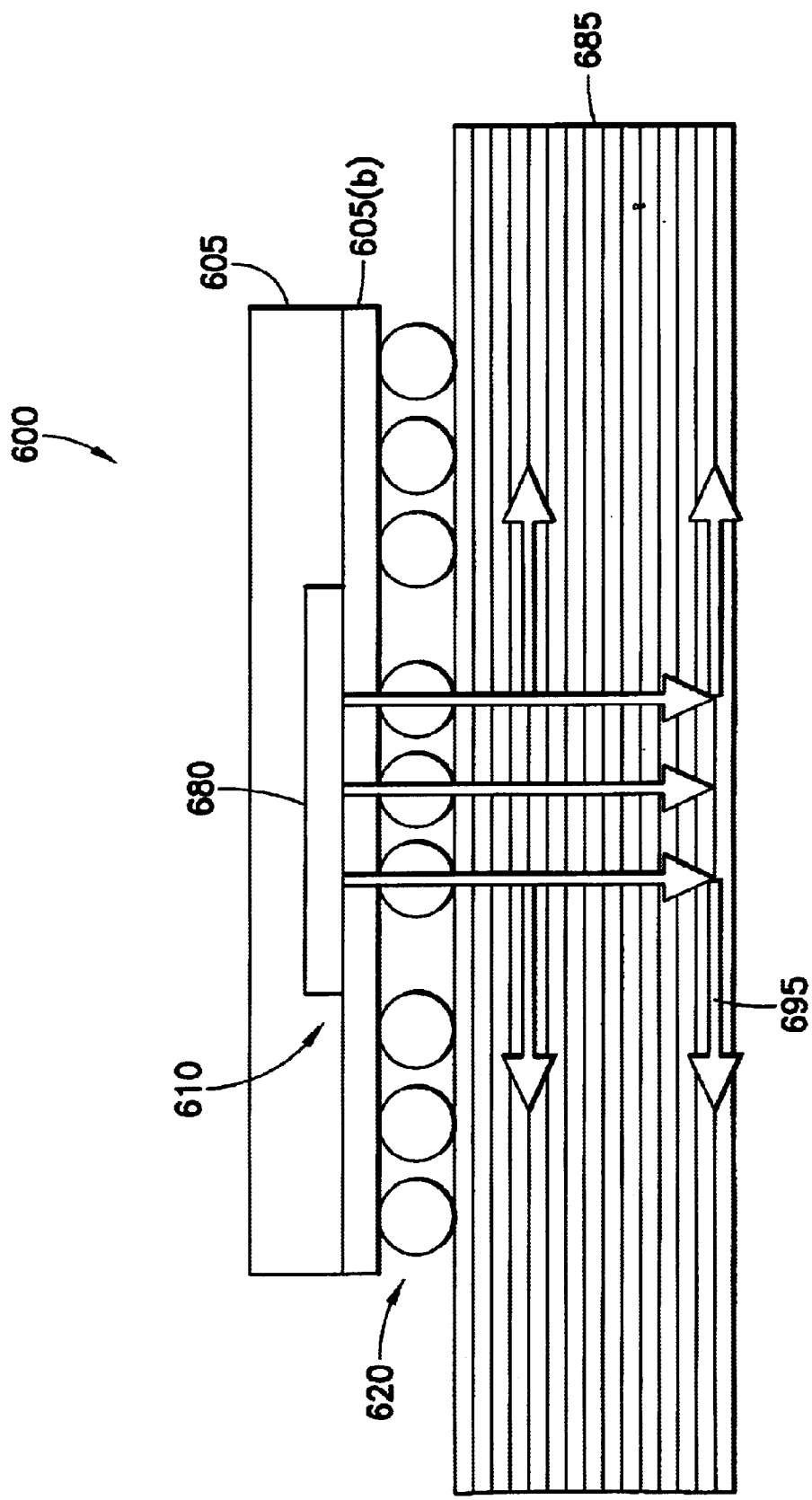
FIG. 6 shows a conventional side view of the heat transfer path from the die pad to the PWB.

FIG. 6 shows a side view 600 of a conventional heat transfer path from the die pad to the PWB without thermal bars. Substrate 605 has a lower, or second, surface 605(b). Chip 680 is mounted on die pad area 610 by adhesive. Adhesive may be, for example, glue, epoxy, resin or any suitable adhesive material that bonds the chip 680 to the die pad area 610. Solder balls 620 are mounted on the PWB 685. The thermally conductive projections, shown generally as 695, provide thermal pathways from the die pad area 610 to the PWB 685.

Figure 7:
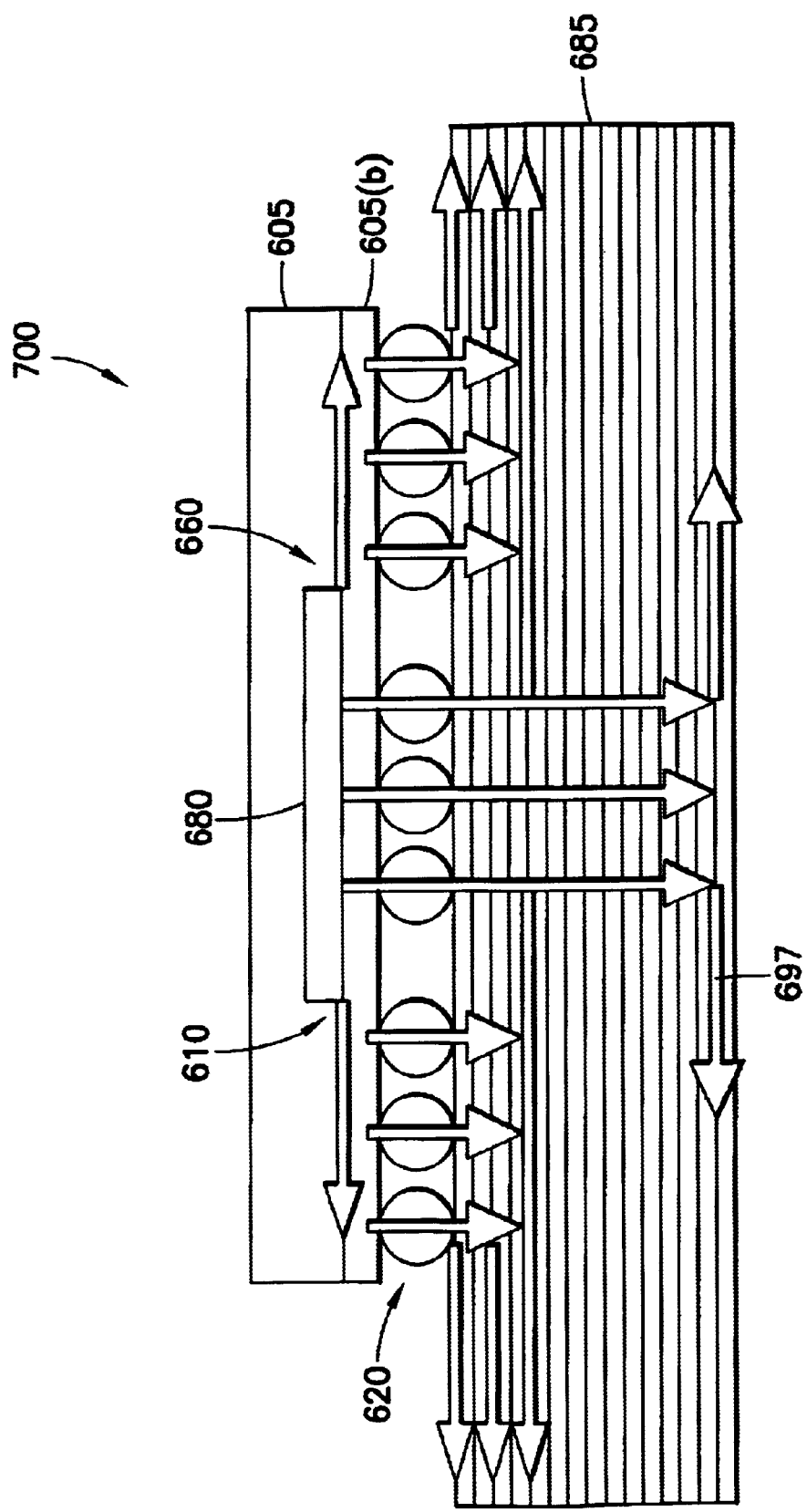
FIG. 7 shows a side view of the present invention of the heat transfer path from the die pad to the PWB.

FIG. 7 shows a side view 700 of the heat transfer path according to the present invention, from the die pad area 610 to the PWB 685 utilizing thermal bars 660. The thermally conductive projections, shown generally as 697, provide additional thermal pathways from the die pad area 610 to the PWB 685. The other elements shown in FIG. 7 have been discussed in relation to FIG. 6.

Figure 8:
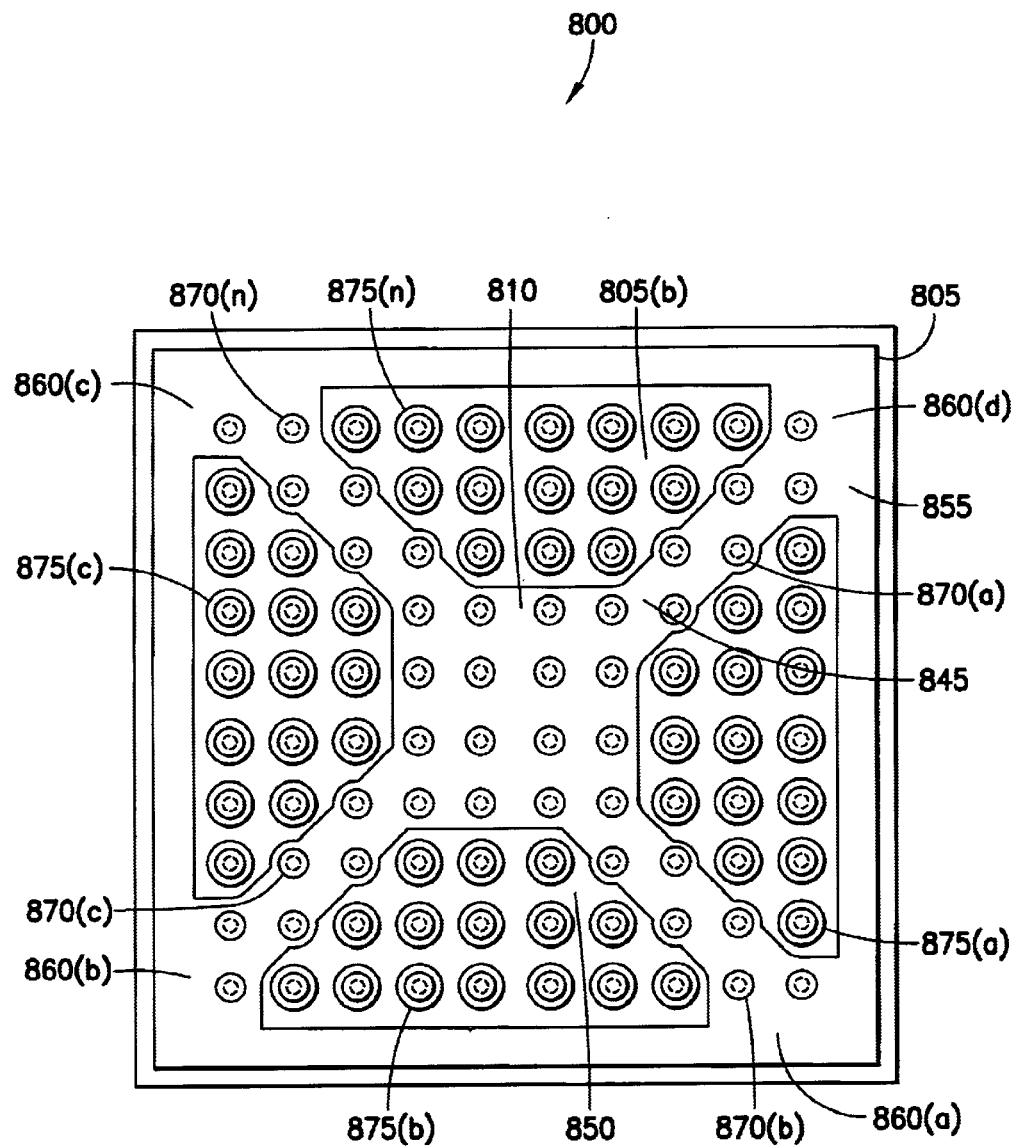
FIG. 8 shows a substrate, from the solder ball side, according to the present invention.
Figure 9:
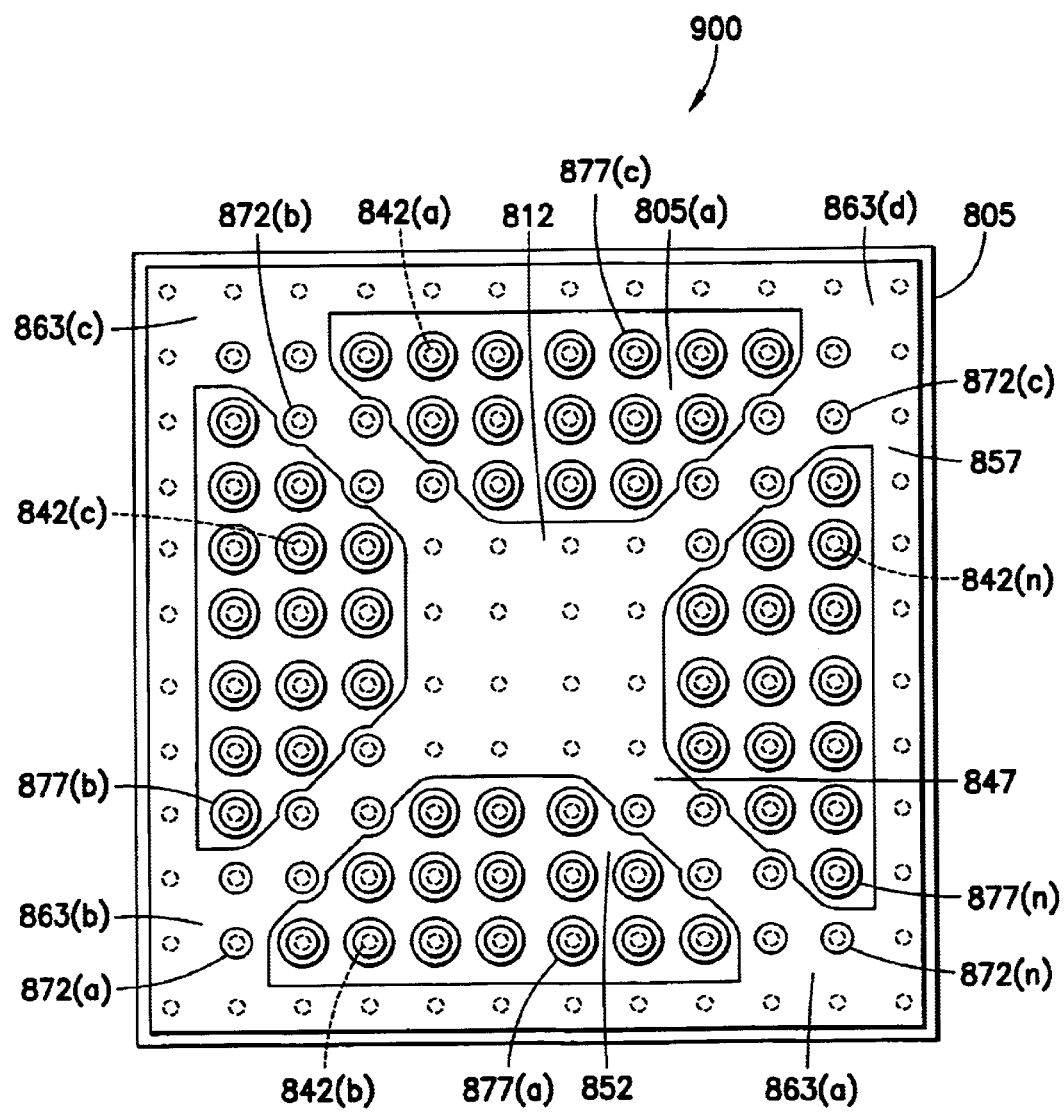
FIG. 9 shows a substrate, from the upper side, according to the present invention.

FIGS. 8 and 9 show the present invention with exemplary conductive layer configurations in the die pad area. These conductive layer configurations are alternate embodiments of the invention. The relationship between the conductive material and insulating material is a function of the design and application requirements.

FIG. 8 shows view 800 from the solder ball side, according to the present invention which includes substrate 805 having die pad area 810 and a second region 850, which is beyond the die pad area and corresponding thermal bar region 845. First solder ball pads, or conductive elements, 870(a) . . . (n), generally 870, are in thermal contact with thermal bars, 860(a) . . . (d), generally 860. Second thermal pads 875(a) . . . (n), are shown generally as 875. These thermal pads are in second area 850 and are not in contact with thermal bars 860.

FIG. 9 shows a view 900 of substrate 805, from the top side, according to the present invention. Surface 805(a) has a die pad area 812 that has thermal bars 863(a) . . . (d), generally 863, that radiate from the die pad area 812 to the thermally conductive radial component edge area 857. The thermal bars 863 enhance thermal dissipation from the die pad area 812 to the thermally conductive radial component edge area 857 to the PWB. Solder ball pads 872(a) . . . (n), generally 872, and 877(a) . . . (n), generally 877, are also shown as well as first and second areas 847 and 852, respectively. Vias, or through bores, 842(a) . . . (n), generally 842, are also shown in FIG. 9. These vias 842 extend from surface 805(a) to surface 805(b), shown in FIG. 8.

Figure 10:
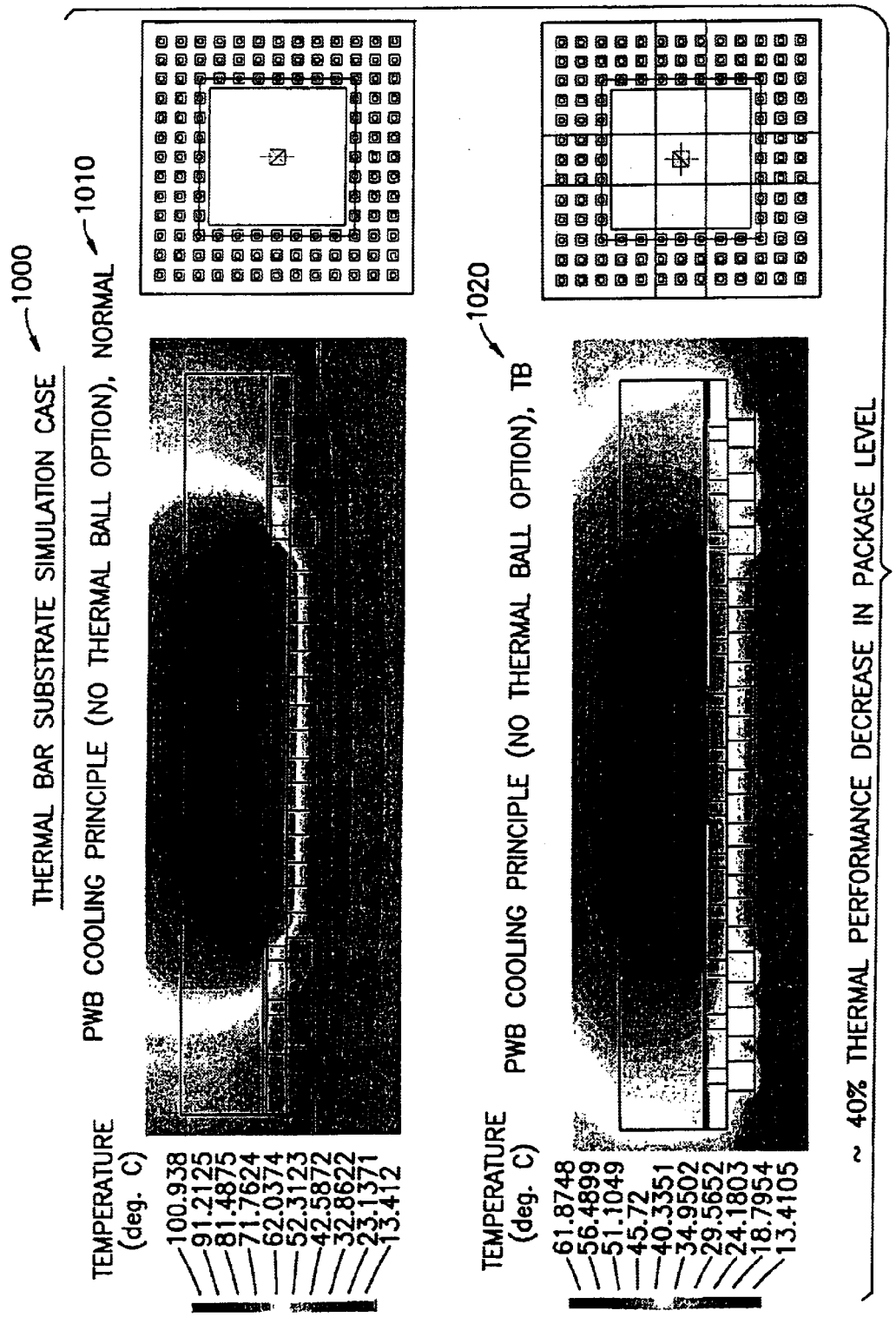
FIG. 10 shows a thermal bar substrate simulation.

FIG. 10 shows a side view 1000 of the heat dissipation paths from a conventional IC package 1010 and from a thermal bar substrate IC package 1020. The operating temperature of the thermal bar substrate package 1020 is approximately 40% less than that of a conventional IC package 1010 providing improved heat dissipation in this case.

While the present invention has been described in terms of a "chip-up" configuration, it is also an embodiment of the present invention to utilize the heat dissipation technique in a "flip-chip" or chip-down configuration. Also, the chip may be encapsulated with an epoxy or resin.

While described in the context of an IC package, it should be appreciated that these teachings have applicability as well to other types of packaging in which heat dissipation is desired. Furthermore, it should be realized that the above teachings are exemplary, and are not to be construed in a limiting sense upon the practice of this invention.

What is claimed is:

1. An integrated circuit package comprising:
    a substrate having a first surface and a second surface;
    a die pad area, disposed on said first surface, said die pad area having dimensions suitable to mount an integrated circuit thereon;
    a first thermally conductive structure disposed at least partially around said die pad area on said first surface;
    a second thermally conductive structure underlying said first thermally conductive structure and disposed on said second surface;
    a first plurality of thermally conductive bars on said first surface that radiate outwardly from the die pad area and that are thermally coupled to said first thermally conductive structure;
    a second plurality of thermally conductive bars on said second surface underlying the first plurality of bars and that are thermally coupled to said second thermally conductive structure; and
    a plurality of thermally conductive vias, at least one of the vias coupled between said first and second thermally conductive structures for providing thermal conductivity from the first surface of the substrate to the second surface of the substrate,
    wherein each of the plurality of thermal bars conduct thermal energy from the die pad area to an associated one of said first thermally conductive structure and said second thermally conductive structure.

2. The integrated circuit package of claim 1, further comprising:
    a plurality of signal balls disposed on the second surface of the substrate and outside the die pad area, at least one of the plurality of signal balls being in thermal contact with an associated one of the plurality of vias, and at least one of the plurality of signal balls being adapted to conduct thermal energy.

3. The integrated circuit package of claim 1, wherein the substrate is thermally coupled to a printed wiring board and the thermal energy is dissipated from the die pad area to the printed wiring board through said first and second thermal bars.

4. The integrated circuit package of claim 1, further comprising an integrated circuit disposed on the die pad area.

5. The integrated circuit package of claim 1, where the plurality of thermal bars are electrically isolated from a plurality of electrically signal conveying vias disposed between said first and second surface.

6. The integrated circuit package of claim 1, wherein the plurality of thermal bars comprise a thermally conducting material that is tangibly and thermally continuous with a thermally conductive material that comprises said first and second thermally conductive structure.

7. A method for dissipating thermal energy from a die pad comprising:
   providing a substrate having a first surface and a second surface, a die pad area, disposed on said first surface, said die pad area having dimensions suitable to mount an integrated circuit thereon;
   providing a first thermally conductive structure disposed at least partially around said die pad area on said first surface and a second thermally conductive structure underlying said first thermally conductive structure and disposed on said second surface;
   thermally coupling a first plurality of thermally conductive bars on said first surface that radiate outwardly from the die pad area to said first thermally conductive structure;
   thermally coupling a second plurality of thermally conductive bars on said second surface underlying the first plurality of bars to said second thermally conductive structure;
   conveying thermal energy using a plurality of thermally conductive vias, at least one of the vias coupled between said first and second thermally conductive structures for providing thermal conductivity from the first surface of the substrate to the second surface of the substrate, and
   transferring thermal energy, using the plurality of thermal bars to conduct thermal energy from the die pad area to an associated one of said first thermally conductive structure and said second thermally conductive structure.

8. The method of claim 7, further comprising:
   providing a plurality of signal balls disposed on the second surface of the substrate and outside the die pad area, at least one of the plurality of signal balls being in thermal contact with an associated one of the plurality of vias, and at least one of the plurality of signal balls being adapted to conduct thermal energy.

9. The method of claim 7, further comprising thermally coupling the substrate to a printed wiring board such that the thermal energy is dissipated from the die pad area to the printed wiring board through said first and second thermal bars.

10. The method of claim 7, further comprising an integrated circuit on the die pad area.

11. The method of claim 7, further comprising electrically isolating the plurality of thermal bars from a plurality of electrically signal conveying vias disposed between said first and second surface.

12. The method of claim 7, further comprising:
   fabricating the plurality of thermal bars from a thermally conductive material that is tangibly and thermally continuous with a thermally conductive material that comprises said first and second thermally conductive structure.

* * * * *